(12) United States Patent  
Magami et al.

(10) Patent No.: US 8,842,093 B2  
(45) Date of Patent: Sep. 23, 2014

(54) TOUCH SENSOR AND FLUORESCENT DISPLAY HAVING THE SAME

(75) Inventors: Tsuyoshi Magami, Mobara (JP); Yoshiaki Washio, Mobara (JP); Yoshiteru Kawashima, Mobara (JP)

(73) Assignee: Futaba Corporation (JP)

( * ) Notice: Subject to any disclaimer, the term of this patent is extended or adjusted under 35 U.S.C. 154(b) by 221 days.

(21) Appl. No.: 13/220,236

(22) Filed: Aug. 29, 2011

(65) Prior Publication Data

US 2012/0050222 A1 Mar. 1, 2012

(30) Foreign Application Priority Data

Sep. 1, 2010 (JP) ................................. 2010-195811

(51) Int. Cl.
- *G06F 3/045* (2006.01)
- *H03K 17/96* (2006.01)
- *H01J 31/12* (2006.01)
- *G06F 3/044* (2006.01)

(52) U.S. Cl.
CPC .... *H03K 17/9622* (2013.01); *H03K 2017/9602* (2013.01); *H01J 31/125* (2013.01); *H03K 2217/960705* (2013.01); *H03K 2217/96046* (2013.01); *G06F 3/044* (2013.01)
USPC .......................................... 345/174; 327/517

(58) Field of Classification Search
USPC ............ 345/173–174; 327/516–517; 361/179
See application file for complete search history.

(56) References Cited

U.S. PATENT DOCUMENTS

| | | | |
|---|---|---|---|
| 6,468,584 B1 * | 10/2002 | Yamaura et al. ............. | 427/120 |
| 7,129,935 B2 * | 10/2006 | Mackey ......................... | 345/174 |
| 7,196,281 B2 * | 3/2007 | Cok et al. ..................... | 200/512 |
| 7,663,607 B2 * | 2/2010 | Hotelling et al. ............. | 345/173 |
| 7,671,289 B2 * | 3/2010 | Matsukawa et al. .......... | 200/313 |
| 8,421,757 B2 * | 4/2013 | Suzuki et al. ................. | 345/173 |
| 2003/0122794 A1 * | 7/2003 | Caldwell ....................... | 345/173 |
| 2004/0238726 A1 * | 12/2004 | Caldwell ....................... | 250/221 |

(Continued)

FOREIGN PATENT DOCUMENTS

| EP | 0 911 906 B1 * | 8/2006 | ............... H01Q 5/00 |
|---|---|---|---|
| JP | 2006344163 | * 12/2006 | ............. G06F 3/041 |

(Continued)

*Primary Examiner* — Dwayne Bost  
*Assistant Examiner* — Ivelisse Martinez Quiles  
(74) *Attorney, Agent, or Firm* — Quarles & Brady LLP

(57) ABSTRACT

An electrostatic capacitance type touch sensor is provided. The touch sensor includes a substrate and a grid pattern formed on a surface of the substrate by a plurality of first linear wires and a plurality of second linear wires, the first linear wires being arranged parallel to each other at a predetermined interval, and the second linear wires being arranged parallel to each other at a predetermined interval and intersecting with the first linear wires. A separation portion is provided to the first linear wires and the second linear wires to form a sensor portion and a dummy sensor portion which are located next to each other and electrically separated from each other. The shape of a gap between the sensor portion and the dummy sensor portion located next to each other is improved not being formed into a band-like shape surrounded by two parallel conductive linear wires, and a boundary between the sensor portion and the dummy sensor portion located next to each other can be less-visible thereby improving the appearance, and the capacitance between the sensor portion and the dummy sensor portion located next to each other is reduced, thereby improving the accuracy of detecting a touch by adjusting the sensitivity.

6 Claims, 6 Drawing Sheets

(56) References Cited

U.S. PATENT DOCUMENTS

| | | | |
|---|---|---|---|
| 2008/0309633 A1* | 12/2008 | Hotelling et al. | 345/173 |
| 2009/0091551 A1* | 4/2009 | Hotelling et al. | 345/174 |
| 2009/0101417 A1* | 4/2009 | Suzuki et al. | 178/18.06 |
| 2009/0153502 A1* | 6/2009 | Jiang et al. | 345/173 |
| 2009/0189867 A1* | 7/2009 | Krah et al. | 345/173 |
| 2009/0250268 A1* | 10/2009 | Staton et al. | 178/18.06 |
| 2010/0096248 A1* | 4/2010 | Yamauchi et al. | 200/600 |
| 2010/0117977 A1* | 5/2010 | Yoshino et al. | 345/173 |
| 2010/0123670 A1* | 5/2010 | Philipp | 345/173 |
| 2010/0301879 A1* | 12/2010 | Philipp | 324/679 |

FOREIGN PATENT DOCUMENTS

| | | | | |
|---|---|---|---|---|
| JP | 2006344163 A | | 12/2006 | |
| JP | 2009009249 | * | 1/2009 | G06F 3/041 |
| JP | 2009009249 A | | 1/2009 | |
| JP | 2010-114015 | | 5/2010 | |

\* cited by examiner

FIG. 4 - PRIOR ART -

FIG. 5  - PRIOR ART -
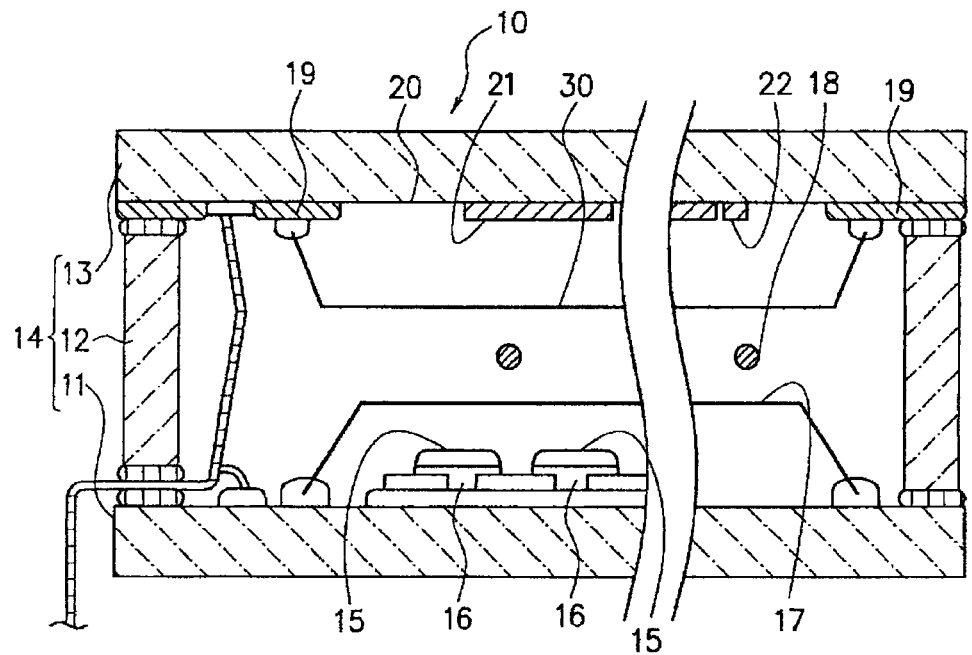
FIG. 6  - PRIOR ART -
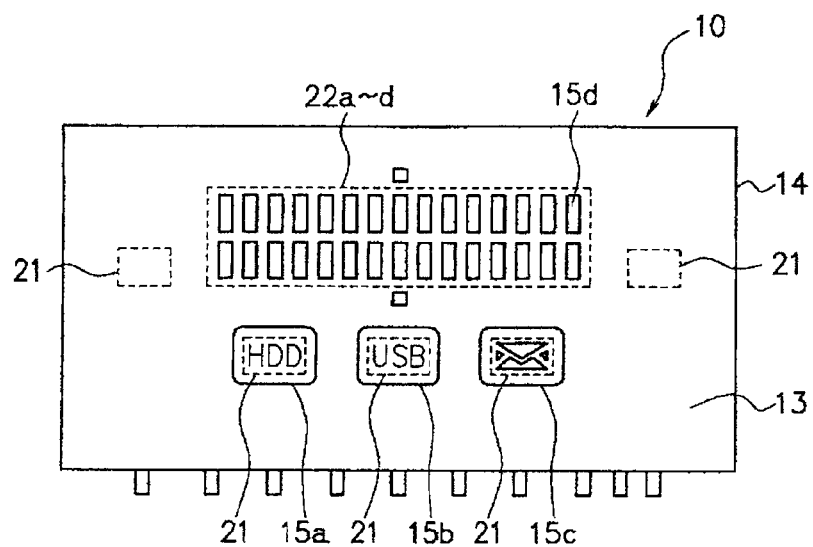

FIG. 7  - PRIOR ART -
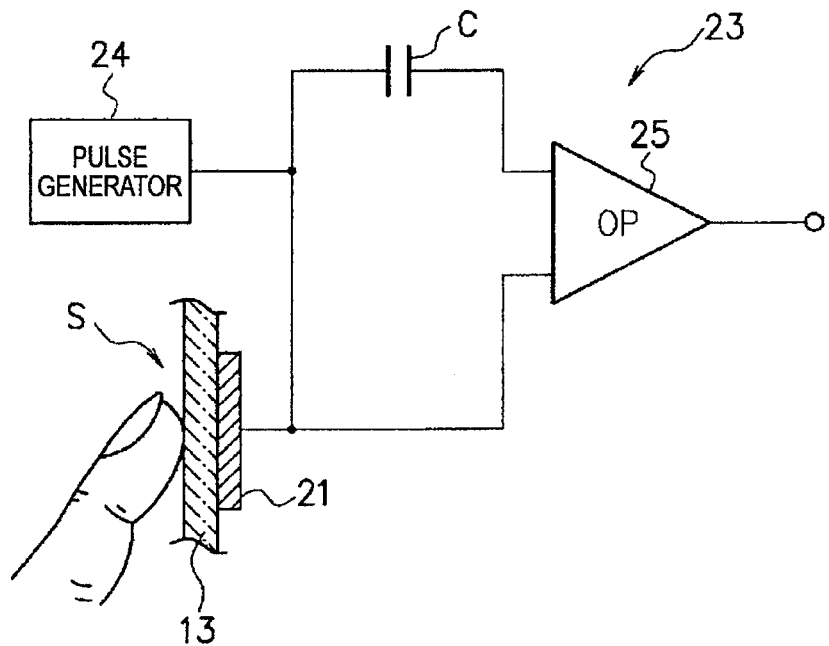
FIG. 8  - PRIOR ART -
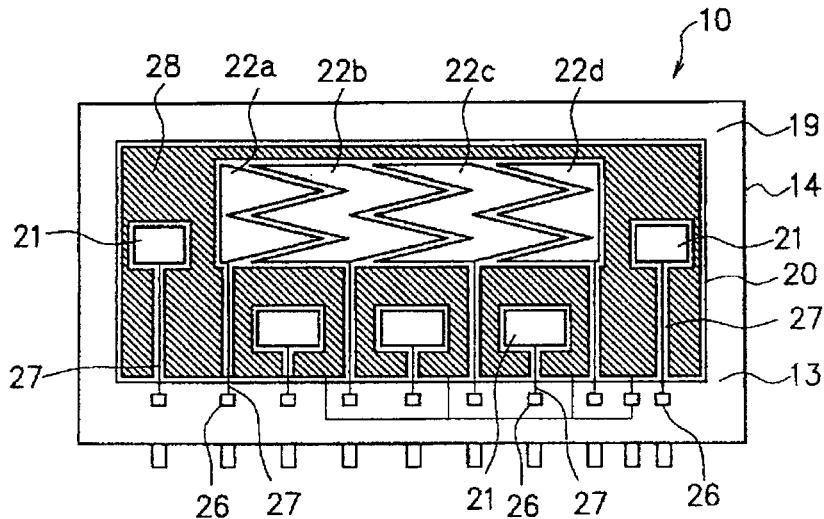

FIG. 9 - PRIOR ART -
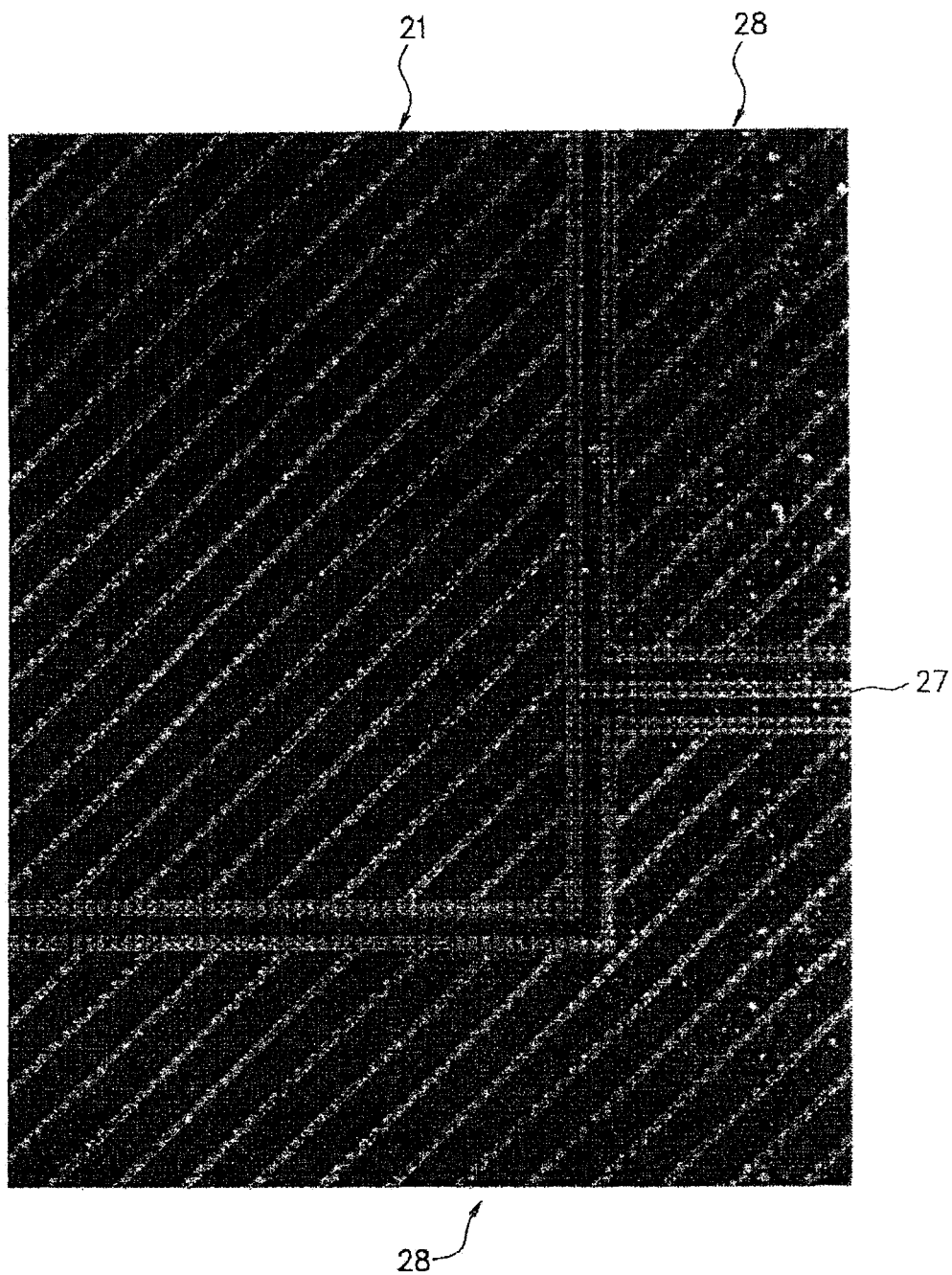

US 8,842,093 B2

TOUCH SENSOR AND FLUORESCENT DISPLAY HAVING THE SAME

CROSS REFERENCE TO RELATED APPLICATION

This application claims priority of Japanese Patent Application No. 2010-195811 and the full content of that application is incorporated by reference.

TECHNICAL FIELD

The present invention relates generally to a touch sensor or a touch switch which detects, based on a change in capacitance, a touch by a user on the touch sensor at a predetermined portion provided with electrodes. More specifically, the present invention is directed to the touch sensor which provides improved appearance by diminishing a boundary between adjacent electrodes and which further provides improved accuracy of detecting a touch on the electrodes by reducing the capacitance between the adjacent electrodes. The present invention further relates to a fluorescent display having the above-described touch sensor.

BACKGROUND OF THE INVENTION

Japanese Patent Application Publication No. 2010-114015 discloses a fluorescent display having an electrostatic capacitance type touch switch mounted on a front plate of an envelope of the fluorescent display. Referring to FIGS. 4 and 5, this fluorescent display 10 includes an envelope 14 constituted of a substrate 11, side plates 12 and a front plate 13 made of glass. As shown in FIG. 5, the fluorescent display 10 includes an anode 16 having a phosphor layer 15 arranged on the substrate 11 inside the envelope 14, a control electrode 17 arranged above the anode 16, and filament-shaped cathodes 18 as an electron source arranged above the control electrode 17. Electrons emitted by the cathode 18 are controlled by the control electrode 17 and impinge on the anode 16, producing the luminescence of the phosphor layer 15. The luminescence of the phosphor layer 15 is visually observed through the front plate 13.

As shown in FIGS. 4 and 5, a frame-shaped, insulating light-shielding layer 19 covers a predetermined portion of an inner face of the front plate 13 adjacent to an outer periphery of the front plate 13, except for terminal portions. A portion surrounded by the light-shielding layer 19 corresponds to a display window 20. In addition, switch electrodes 21, 22 are provided on the inner face of the front plate 13 corresponding to the display window 20.

As shown in FIG. 4, the switch electrodes are arranged on the display window 20, the switch electrodes including the switch electrodes 21 and the linear switch electrodes 22 arranged in sets of four (22a-22d) and capable of outputting with position resolution of for example 128. Furthermore, a shield electrode 30 is provided between the cathode and some of the switch electrodes 21, 22 to prevent the switch electrodes 21, 22 from being charged with electrons.

Referring now to FIG. 6, there is shown a positional relationship of the switch electrodes 21 and the patterned phosphor layers 15 arranged within the outline of the substrate 11. FIG. 6 shows exemplary patterns of the phosphor layers 15, including a pattern 15a indicating "HDD", a pattern 15b indicating "USB", a pattern 15c indicating a logo featuring a mail and a pattern 15d indicating a bar. In addition, the dotted rectangles overlapped on the respective patterns indicate positions of the switch electrodes 21 and the linear switch electrodes 22a-22d.

When a finger of a user touches on an outer face of the front plate 13 having the switch electrodes 21 related to the respective phosphor layers 15, the electrostatic capacitance of this switch electrode 21 changes. A switch control circuit detects this change in capacitance, judges whether it corresponds to ON or OFF of the switch and provides outputs as ON or OFF of the switch. Then, this output is received by a display control part which then controls the phosphor layer 15 corresponding to the switch to light up or not to light up based on the ON or OFF of the switch.

When the finger of the user touches on the outer face of the front plate 13 corresponding to the linear switch electrode 22, the output value from the linear switch electrode 22 continuously changes according to the position on the front plate 13. Thus, the light up of the bar can be controlled.

Referring now to FIG. 7, the following describes the operation of the above-described touch switch. A control part 23 includes a pulse generator 24, a comparator circuit 25 and a capacitor C connected between the pulse generator 24 and one input of the comparator circuit 25. The switch 21 is connected between the pulse generator 24 and the other input of the comparator circuit 25.

When the finger of the user touches on the outer face (a touch portion S) of the front plate 13 corresponding to the switch electrode 21, the electrostatic capacitance between the finger and the switch electrode 21 is induced, producing a kind of a capacitor. In addition, the capacitor C connected between the pulse generator 24 and one input of the comparator circuit 25 is arranged to have the electrostatic capacitance substantially equal to that of the switch electrode 21 not in contact with the finger.

When the finger of the user touches the touch portion S, then the outer face contacting the finger serves as a dielectric material, thereby changing the electrostatic capacitance of the switch electrode 21. Thus, the produced difference in the electrostatic capacitance between the switch electrode 21 and the capacitor C causes the difference in pulse voltages applied to the both inputs of the comparator circuit 25, producing an output from the comparator circuit 25.

FIG. 8 shows an example of the above-described conventional fluorescence display 10. As shown, there is provided a dummy pattern 28 which covers the display window 20, except for the regions corresponding to the switch electrodes 21, the linear switch electrodes 22a-22d and leading wires 27 connecting the switch electrodes 21, 22a-22d and terminal portions 26.

The dummy pattern 28 is formed by strip or mesh-shaped thin wires arranged at a predetermined interval. These thin wires are made of a metallic thin film having the width equivalent to that of the switch electrode 21. This dummy pattern 28 functions to equalize the transmittance throughout the display area. This dummy pattern 28 also prevents an error in reaction of the touch switch.

FIG. 9 shows an enlarged photograph of the fluorescent display 10 having the conventional electrostatic capacitance type touch switch explained above. FIG. 9 shows an example of an actual structure of the touch switch and the dummy pattern. The switch electrode 21 as a touch switch is arranged within a frame at an outer periphery and is formed by slanted strip-shaped thin wires arranged at a predetermined interval with respect to each other. Also, the dummy pattern 28 located next to the switch electrode 21 is formed by electrodes arranged similar to the switch electrode 21. Furthermore, the leading wire 27 connecting the switch electrode 21 with an eternal component extends linearly from the frame. The leading wire 27 is arranged at a predetermined interval from the frame of the dummy patterns 28 located next to the switch electrode 21. Thus, a gap between the switch electrode 21 and the dummy pattern 28 is formed into a band-like shape having a predetermined width defined by the frame of the switch electrode 21 and the dummy pattern 28. Similarly, a gap between the leading wire 27 of the switch electrode 21 and the frame of the dummy pattern 28 is formed into a band-like shape having a predetermined width.

Referring now to FIG. 3, the graph shows the electrostatic capacitance in a touch state in which a finger of a user is in contact with the touch switch and in a non-touch state in which a finger of a user is not in contact with the touch switch of the electrostatic capacitance type touch switch. The left graph (a) corresponds to the present invention and the right graph (b) corresponds to prior art as a comparative example. The control part 23 of the touch switch continuously measures the electrostatic capacitance, namely, count value, for the switch electrode 21 and determines whether the state is in the touch state or in the non-touch state based on the change in the count value. Generally, it is preferable that the count value in the non-touch state (i.e. a base capacitance) is small while the change in the count value in the touch state (i.e. a capacitance change) is large.

Thus, the control part 23 is arranged to change the base capacitance and the capacitance change by adjusting the sensitivity within the count value range below the upper limit of the count value determined by software installed in the control part 23. That is, the smaller the base capacitance is, the more the capacitance change can be increased and widened by increasing the counting scale within the sensitivity adjustable range. Thus, the sensitivity can be improved.

In the exemplary structure shown in FIG. 9, the width of the leading wire 27 is 0.05 mm, the gap between the switch electrode 21 and the dummy pattern 28 is 0.06 mm, the width of the thin wire for both of the switch electrode 21 and the dummy pattern 28 is 0.03 mm, the interval between the respective thin wires for both of the switch electrode 21 and the dummy pattern 28 is 0.18 mm, and the transmittance of both of the switch electrode 21 and the dummy pattern 28 is 83%

However, there is a problem in the conventional electrostatic capacitance type touch switch having the structure shown in FIG. 9. That is, a boundary between the switch electrode 21 and the dummy pattern 28 located next to each other at the predetermined interval, for example 0.06 mm in the touch switch shown in FIG. 9 is visually prominent and appealing. Similarly, a boundary between the dummy pattern 28 and the leading wire 27 of the switch electrode 21 located next to each other at the predetermined interval, for example 0.06 mm in the touch switch shown in FIG. 9, is also visually prominent and appealing. Thus, the appearance of the touch switch is not good.

Furthermore, there is another problem in the conventional electrostatic capacitance type touch switch shown in FIG. 9. That is, the gap between the switch electrode 21 and the dummy pattern 28 as well as the gap between the leading wire 27 of the switch electrode 21 and the frame of the dummy pattern 28 are formed into a band-like shape. Thus, the capacitance between the switch electrode 21 and the dummy pattern 28 or the capacitance between the leading wire 27 and the frame of the dummy pattern 28 becomes great with an increase in the size of the structure. Thus, as shown in the right graph (b) of FIG. 3, the base capacitance for the non-touch state is very close to the upper limit of the count value determined by the performance of the software of the control part 23. Thus, if the difference in the capacitance in the touch state and the non-touch state is the same for the case with the base capacitance being very close to the upper limit of the count value as described above and the case with the relatively small base capacitance, the difference in the capacitance with respect to the base capacitance becomes relatively small for the case with the base capacitance being very close to the upper limit of the count value compared to the case with the relatively small base capacitance. Thus, it is difficult to improve the accuracy of detecting a touch based on the change in capacitance by enhancing the sensitivity by increasing the difference in capacitance within the count range by adjusting the sensitivity, as described above.

SUMMARY OF THE INVENTION

In view of the above problems, an object of the present invention is to provide a touch sensor which detects a touch by a user on the touch sensor at a predetermined portion provided with electrodes based on a change in capacitance, in which a boundary between the adjacent electrodes is made less-visible, thereby improving the appearance of the touch sensor, and in which the capacitance between the adjacent electrodes is made relatively small compared to the conventional art, thereby improving the accuracy of detecting the touch on the touch sensor.

In order to achieve the above object, the present invention provides a touch sensor having a substrate and a grid pattern formed on a surface of the substrate by a plurality of first linear wires and a plurality of second linear wires, wherein the first linear wires are arranged parallel to each other at a predetermined interval, and the second linear wires are arranged parallel to each other at a predetermined interval and intersecting with the first linear wires. A separation portion is provided to the first linear wires and the second linear wires to form a sensor portion and a dummy sensor portion which are located next to each other and electrically separated from each other.

Furthermore, according to the present invention, a portion of the first linear wire or the second linear wire constituting the sensor portion is arranged to extend out of the dummy sensor portion through the separation portion of the first linear wires or the second linear wires constituting the dummy sensor portion.

Furthermore, the present invention provides a fluorescent display which includes an envelope, a cathode arranged inside of the envelope and emits electrons, an anode arranged inside of the envelope and having a phosphor layer, the phosphor layer being arranged to emit light when the electrons emitted by the cathode impinge on the phosphor layer, and a touch sensor having a substrate and a pattern formed on a surface of the envelope by a plurality of first linear wires and a plurality of second linear wires. The first linear wires are arranged parallel to each other at a predetermined interval, and the second linear wires are arranged parallel to each other at a predetermined interval and intersecting with the first linear wires, and wherein by providing a separation portion to the first linear wires and the second linear wires, a sensor portion and a dummy sensor portion are formed which are located next to each other and electrically separated from each other.

According to the touch sensor of the present invention, the sensor portion and the dummy sensor portion are formed in the grid pattern which are located next to each other and electrically separated from each other by providing the separation portion to the first linear wires and the second linear wires. Thus, a gap between the sensor portion and the dummy sensor portion located next to each other are formed by an end of one of the first linear wire and the second linear wire being located next to the other one of the first linear wire and the second linear wire across the separation portion. In consequence, the gap is not formed into a band-like shape formed by the two parallel linear conductors as is the case for the conventional art. Thus, the boundary between the sensor portion and the dummy sensor portion can be less-visible, improving the appearance. Furthermore, the capacitance between the sensor portion and the dummy sensor portion located next to each other can be significantly reduced. Thus, there is provided a significant improvement in the accuracy of judging whether it is in the touch state in which a finger of a user is in contact with the touch switch or in the non-touch state in which a finger of a user is not in contact with the touch switch based on the change in capacitance in the touch state.

The portion of the first linear wire or the second linear wire constituting the sensor portion is arranged to extend out of the dummy sensor portion through the separation portion of the first linear wires or the second linear wires constituting the dummy sensor portion. In consequence, a gap between the leading wire of the sensor portion and the dummy sensor portion is also formed by an end of the linear wire of the dummy wire being located next to the leading wire across the separation portion. Thus, the gap is not formed into a band-like shape formed by the two parallel linear conductors as is the case for the conventional art. Thus, the boundary between the leading portion of the sensor portion and the dummy sensor portion can also be less-visible, further improving the appearance. Furthermore, the capacitance between the leading wire of the sensor portion and the dummy sensor portion can also be significantly reduced. Thus, there is provided a significant improvement in the accuracy of detecting a touch from the change in capacitance.

According to the present invention, since the boundary between the sensor portion and the dummy sensor portion is arranged less-visible. As a result, the fluorescent display including the touch sensor having the improved quality of display and improved accuracy of detecting a touch can be provided.

BRIEF DESCRIPTION OF THE DRAWINGS

FIG. 4 is a front view of a fluorescent display having a conventional touch switch;

FIG. 5 is a cross-sectional view of the fluorescent display taken along the line X-X shown in FIG. 4;

FIG. 6 is an illustration showing a positional relationship between a switch electrode and a phosphor pattern of the fluorescent display having the conventional touch switch;

FIG. 7 is an illustration showing operation principle of the conventional touch switch;

FIG. 8 is a front view of the fluorescent display having the conventional touch switch; and FIG. 9 is an enlarged photograph of an exemplary structure of the conventional touch switch shown in FIG. 8.

DETAILED DESCRIPTION OF THE PREFERRED EMBODIMENT

A touch sensor according to one embodiment of the present invention will be described below with reference to the drawings. The touch sensor according to one embodiment of the present invention may be provided at a front plate 13 of an envelope 14 of a fluorescent display 10 such as the one illustrated in FIG. 4. Furthermore, for the present invention, the structures other than the structure of electrodes, i.e. the detection principle of the touch sensor of the present invention and the reason for providing a dummy sensor portion same as the conventional art explained hereinabove. Thus, the following description of an embodiment of the present invention will describe mainly about the structure of electrodes of the touch sensor of the present invention provided to an inner face of the front plate 13, and for simplicity, the description about the structures other than the structure of electrodes should be substituted for the above description along with the related drawings and are thus omitted.

Figure 1:
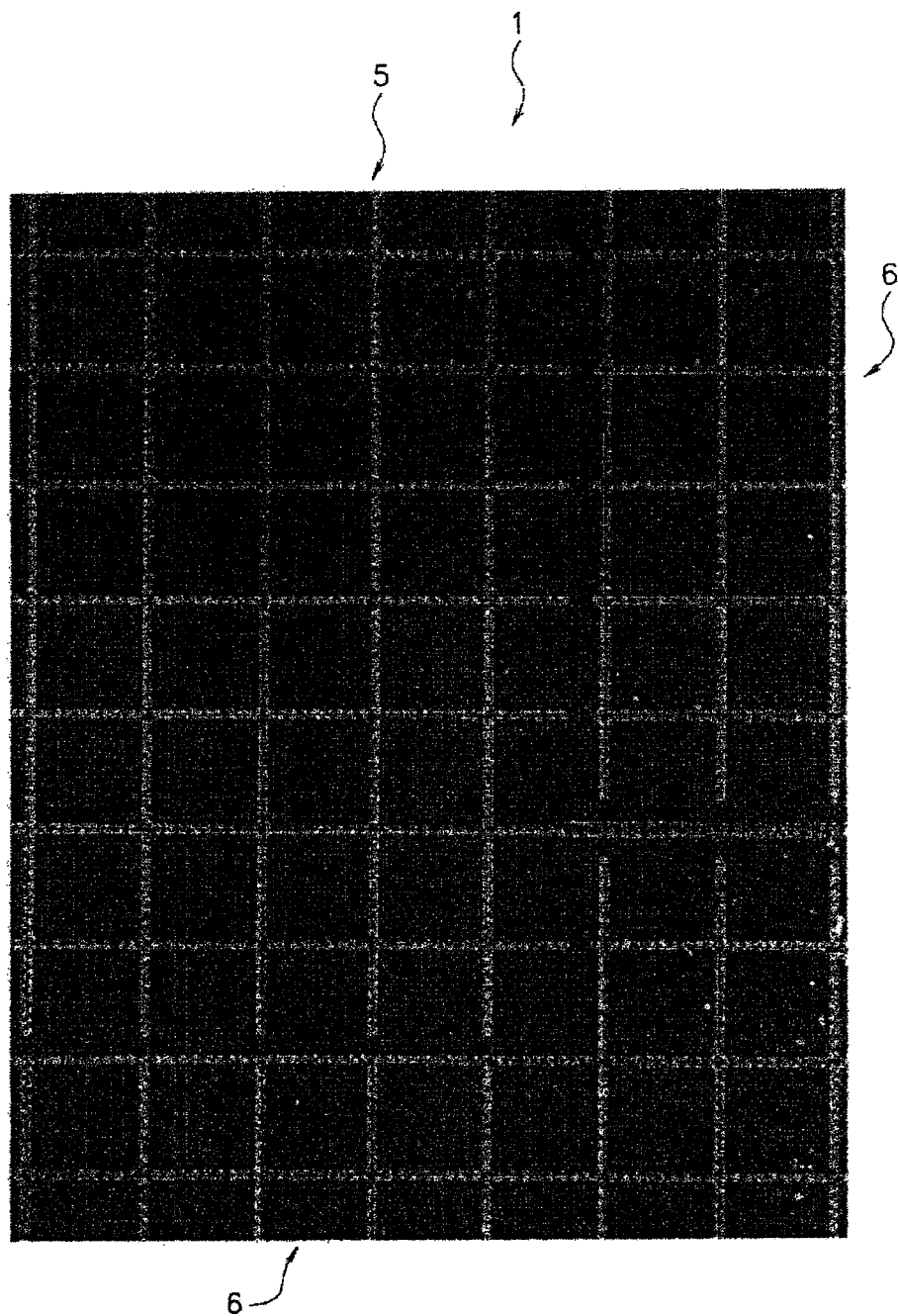
FIG. 1 is an enlarged photograph of one exemplary structure of a touch sensor according to an embodiment of the present invention.
Figure 2:
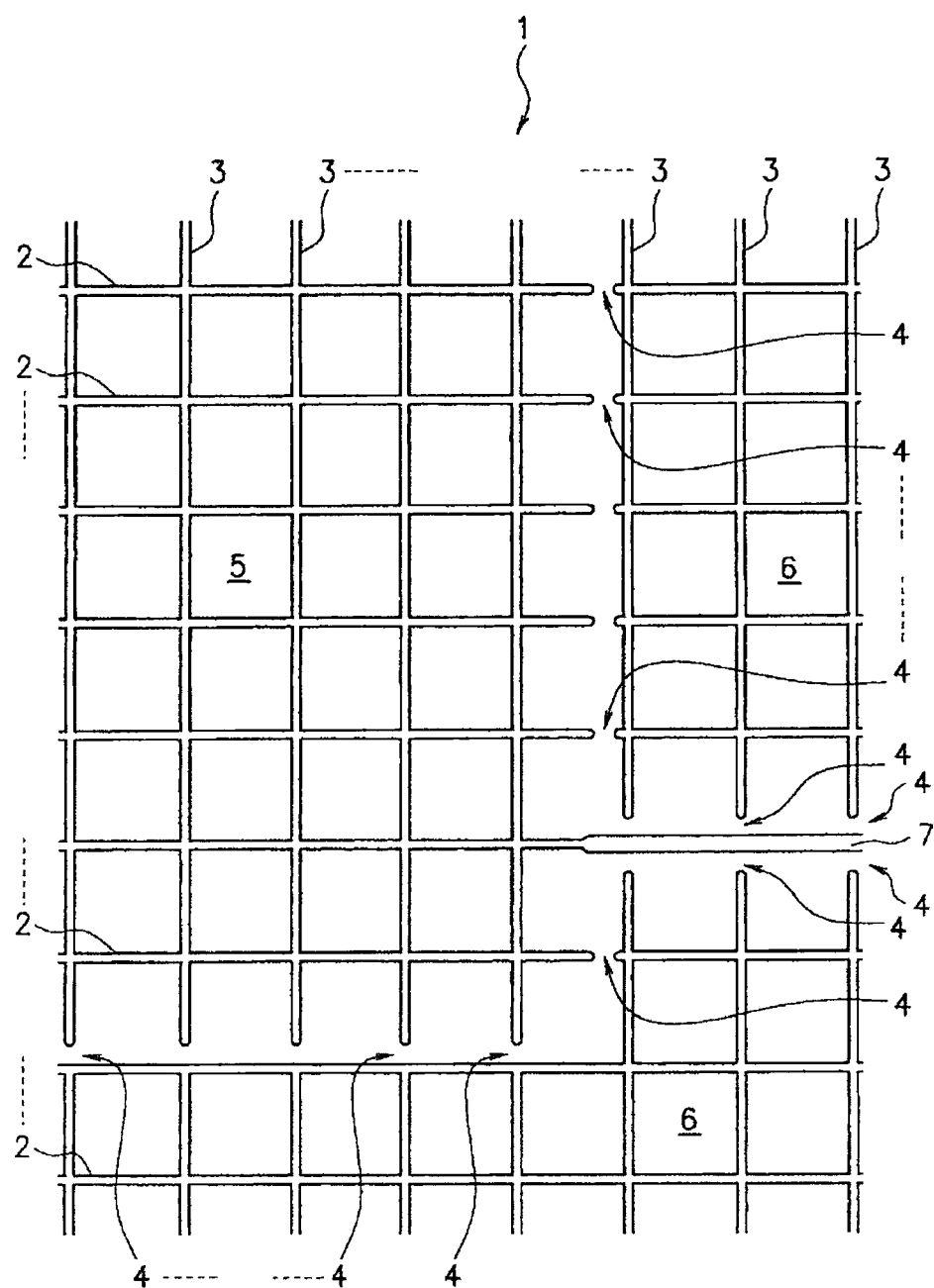
FIG. 2 is an illustration corresponding to the photograph of the touch sensor according to an embodiment of the present invention shown in FIG. 1.

FIG. 1 is an enlarged photograph of a touch sensor 1 according to one embodiment of the present invention. The illustration shown in FIG. 2 corresponds to the photograph of FIG. 1. The touch sensor 1 may be arranged at an inner surface of a front plate 13 of an envelope 14 of a fluorescent display 10 such as the one shown in FIGS. 4 and 5. The touch sensor 1 includes a grid pattern arranged in a square fashion as shown in FIG. 2. This pattern is formed by a plurality of first linear wires 2 extending along a right-left direction in the drawing arranged parallel to each other at an interval and a plurality of second linear wires 3 extending along an up-down direction in the drawing arranged parallel to each other at the same interval as the first linear wires 2 and arranged to intersect with the first linear wires 2 at a right angle. The grid pattern is formed on the inner face of the front plate 13 and integrally formed by a conductive material such as aluminum. Furthermore, a separation portion 4 is provided at the linear wire 2, 3 by cutting a portion of the linear wire 2, 3, thereby forming a sensor portion 5 and a dummy sensor portion 6 in the grid pattern. Thus, the sensor portion 5 and the dummy sensor portion 6 are arranged next to each other while being electrically separated from each other, as shown in FIG. 2. It should be understood that the plurality of first linear wires 2 as well as the plurality of second linear wires 3 may not be perfectly parallel to each other due to, for example, inaccuracy in formation of the pattern.

As described above, the separation portions 4 are provided at the first linear wires 2, respectively, at the same position in the right-left direction. Similarly, the separation portions 4 are provided at the second linear wires 3, respectively, at the same position in the up-down direction. In such a manner, the grid pattern is divided into the sensor portion 5 and the dummy sensor portion 6 at the separation portions 4, electrically separating the sensor portion 5 and the dummy sensor portion 6 from each other at the separation portions 4. Thus, the separation portions 4 form a boundary between the sensor portion 5 and the dummy sensor portion 6.

Furthermore, a leading wire 7 is formed on a portion of the first linear wire 2 constituting the sensor portion 5. This leading wire 7 extends out of the dummy sensor portion 6 through the separation portions 4 of the second linear wires 3 constituting the dummy sensor portion 6. The leading wire 7 is connected to a terminal portion 26 such as the one shown in FIG. 8. In addition, the width of the leading wire 7 is arranged thicker than the width of the respective linear wires 2 and 3.

The sensor portion 5 is connected to a control part 23 such as the one shown in FIG. 7. The dummy sensor portion 6 is necessary for the equalization of the transmittance throughout a display area as well as for the prevention of an error in the reaction of the sensor portion 5 caused by the electrostatic charge in the front plate. The dummy sensor portion 6 is grounded, otherwise the electrical charge is accumulated in the dummy sensor 6 and the electrostatic capacitance between the dummy sensor portion 6 and the sensor portion 5 located next to each other increases, causing this sensor portion 5 to react in the non-touch state, or causing an increase in the count value of this sensor portion 5 in the touch state which leads to the malfunction of the sensor portion 5. Thus, it is preferable to ground the dummy sensor portion 6. In the description, the "touch state" means a state in which a finger of a user is in contact with the touch sensor, and the "non-touch state" means a state in which a finger of a user is not in contact with the touch sensor. Technically speaking, the "touch state" may include a state in which a finger of a user is placed very close to the touch sensor without contacting the touch sensor such that the electrostatic capacitance is changed.

At the boundary formed between the sensor portion 5 and the dummy sensor portion 6, respective ends of the second linear wires 3 of the sensor portion 5 are arranged to face the first linear wire 2 of the dummy sensor portion 6 at a predetermined interval. Similarly, respective ends of the first linear wires 2 of the sensor portion 5 are arranged to face the second linear wire 3 of the dummy sensor portion 6 at a predetermined interval.

Furthermore, at the boundary formed between the leading wire 7 and the dummy sensor portion 6, the leading wire 7 and respective ends of the second linear wires 3 of the dummy sensor portion 6 located on both sides of the leading wire 7 are arranged to face each other at a predetermined interval.

For the touch sensor 1 according to one embodiment of the present invention shown in FIGS. 1 and 2, the width of the leading wire 7 is 0.05 mm, a gap between the sensor portion 5 and the dummy sensor portion 6 is 0.06 mm, and the width of the linear wires 2, 3 is 0.03 mm. These dimensions are the same as the conventional art shown in FIG. 9. However, in the embodiment of the present invention explained above and shown in FIGS. 1, 2, the interval between the linear wires 2, 3 of the sensor portion 5 and the dummy sensor portion 6 is 0.36 mm, which is twice as large as that of the conventional art shown in FIG. 9. With these dimensions, the transmittance of the sensor portion 5 and of the dummy sensor portion 6 is 84%, which is substantially the same as that of the conventional art shown in FIG. 9 which is 83%.

The reasons for selecting the above-described dimensions of the conductive materials of the touch sensor 1 is as follows. Regarding the transmittance, further reduction in the area of the aluminum may cause trouble in reaction of the touch sensor 1. In addition, the linear wire having the width of 0.03 mm does not visibly stand out and is optimal for stable manufacture. If the width of the linear wire is reduced to 0.015 mm to further improve the appearance, then it is difficult to manufacture the linear wires stably due to an increase in chance of breakage of the linear wires. Furthermore, the width of the leading wire 7 may be 0.03 mm which is the same of the width of the linear wires; however the chance of breakage of the linear wire or the leading wire during the manufacture can be reduced by setting the width of the leading wire 7 to 0.05 mm.

The structure of the electrodes of the touch sensor 1 described above may be formed by evaporating aluminum throughout the inner face of the front plate of the envelope of the fluorescent display, followed by patterning the aluminum using the photolithographic approach. Alternatively, the square-fashioned grid pattern may be formed on the inner face of the front plate using aluminum including the leading wire 7 which is thicker than the linear wire, followed by removing unnecessary portion of the linear wire to form the separation portion 4.

According to the touch sensor 1 described above, by providing the separation portion 4 at the linear wires 2, 3 constituting the square grid pattern, there are provided the sensor portion 5 and the dummy sensor portion 6 which are formed next to each other at an interval and which are electrically separated. Thus, the gap between the sensor portion 5 and the dummy sensor portion 6 located next to each other is formed such that the end of one linear wire 2, 3 are arranged to face the other linear wire 3, 2 across the separation portion 4. Thus, the gap between the sensor portion 5 and the dummy sensor portion 6 is not formed into a band-like shape formed by the two parallel linear conductors as for the conventional art.

Similarly, for the leading wire 7 of the sensor portion 5 and the dummy sensor portion 6, the gap between the leading wire 7 and the dummy sensor portion 6 is formed such that the ends of the linear wires of the dummy sensor portion 6 are arranged to face the leading wire 7 across the separation portions 4. Thus, the gap between the leading wire 7 and the dummy sensor portion 6 is also not formed into a band-like shape formed by the two parallel linear conductors as for the conventional art.

Therefore, the boundary between the sensor portion 5 and the dummy sensor portion 6 as well as the boundary between the leading wire 7 of the sensor portion 5 and the dummy sensor portion 6 can be less-visible, improving the appearance of the touch sensor 1. Especially, even when the background of the display portion of the fluorescent display is emitting light, the structure of the electrodes remains less-visible. This is desirable for quality display.

Furthermore, the capacitance between the sensor portion 5 and the dummy sensor portion 6 located next to each other as well as the capacitance between the leading wire 7 of the sensor portion 5 and the dummy sensor portion 6 located next to each other are sufficiently reduced from that of the conventional art. Thus, by adjusting the sensitivity, there is provided a significant improvement in the accuracy of judging whether it is in the touch state or in the non-touch state based on the change in capacitance from the non-touch state to the touch state.

Figure 3:
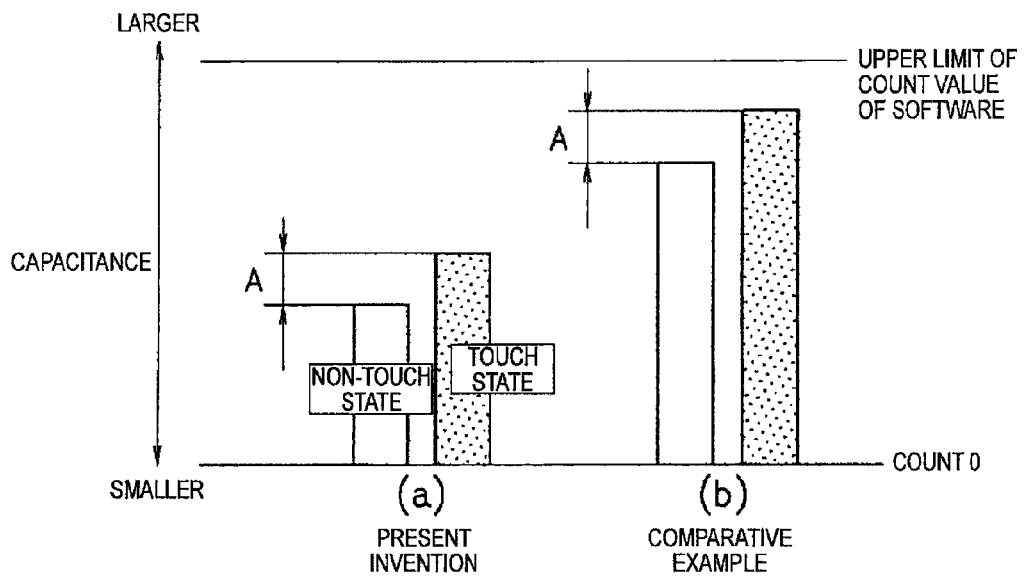
FIG. 3 is a graph showing electrostatic capacitance of an electrostatic capacitance type touch sensor for a touch state and a non-touch state, in which the left graph (a) corresponds to the embodiment of the present invention and the right graph (b) corresponds to prior art as a comparative example.
Figure 3:
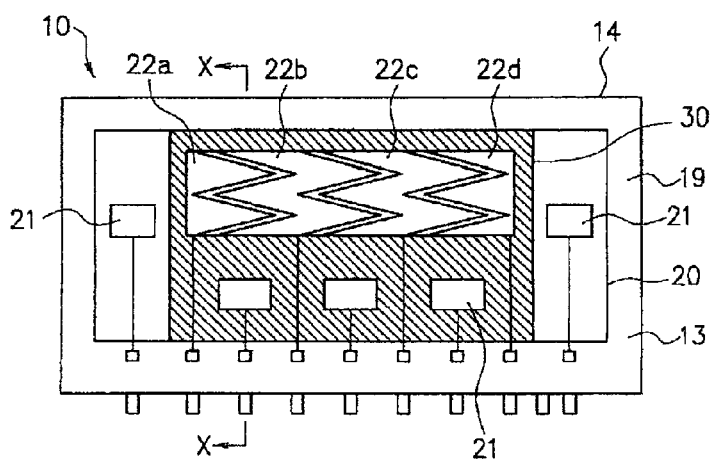

Referring now to FIG. 3, the left graph (a) shows the capacitance in the touch state and the non-touch state for the embodiment of the present invention, and the right graph (b) shows the capacitance in the touch state and the non-touch state for prior art as a comparative example. As shown, for the embodiment of the present invention, the difference in capacitance between the touch state and the non-touch state is A. Also, for the comparative example, the difference in capacitance between the touch state and the non-touch state is also A. Thus, the mount of changes in capacitance in the touch state is equal for the embodiment of the present invention and the comparative example. This is because, as described above, the transmittance and the opening ratio of sensor portion 5 and of the dummy portion 6 are substantially the same for the embodiment of the present invention and the comparative example, and therefore the basic detection sensitivity is substantially the same for the embodiment of the present invention and the comparative example.

However, as can be seen from FIG. 3, the count value in the non-touch state (i.e. the base capacitance) is smaller in the embodiment of the present invention compared to the comparative example. This is because for the comparative example the capacitance between the switch electrode 21 and the dummy pattern 28 is large, whereas for the embodiment of the present invention the capacitance between the sensor portion 5 and the dummy sensor portion 6 is made small due to the characteristic structure of the electrodes described above.

Therefore, in the embodiment of the present invention, the sensitivity adjustment can be performed effectively within the count value range below the upper limit of the count value determined by the software installed in the control part 23 shown in FIG. 3. That is, since the base capacitance of the present invention is smaller than that of the conventional art, by increasing the counting scale used to measure the count value within the sensitivity adjustable range, both of the count value of the base capacitance and the count value of the capacitance in the touch state can be increased at the same rate, respectively. In consequence, the difference between the both count values, i.e. the mount of change in capacitance in the touch state can be increased and widened. As a result, the detection sensitivity for identifying the touch state and the non-touch state can be improved.

As described above, according to the touch sensor 1 for the embodiment of the present invention, the sensor portion 5 and the dummy sensor portion 6 are formed by providing the separation portions 4 in the same grid pattern. Thus, the boundary between the sensor portion 5 and the dummy sensor portion 6 can be made less-visible. Furthermore, the size of the structure of the capacitor constituted of the opposing sensor portions 5 and 6 can be downsized, thereby reducing the base capacitance and improving the detection sensitivity.

Although the touch sensor 1 in the embodiment described above is mounted to the inner face of the front plate 13 of the fluorescent display 10, the touch sensor 1 of the present invention may be mounted to an outer face of the front plate 13 of the fluorescent display 10. Furthermore, the touch sensor 1 may be arranged on a substrate of another member, and this member may be mounted on the outer face of the front plate 13 of the fluorescent display 10. Alternatively, the touch sensor 1 may be arranged at other various display elements such as a liquid crystal display element, an organic light emitting display element and a field emission display.

Furthermore, the touch sensor of the present invention may be arranged as a single touch sensor independently of the display elements including the fluorescent display. For example, the electrode structure of the touch sensor may be formed on one face of an insulating substrate so as to detect a touch on the other face of the insulating substrate.

It is to be understood that, the electrodes constituting the touch sensor is not limited to aluminum, but may be any conductive material such as non-translucent conductive film and transparent conductive film. Moreover, the grid pattern may not be arranged into a square-shaped pattern, but may be arranged, for example, into a rhombus-shaped pattern in which the first linear wires are arranged at an angle other than a right angle with respect to the second linear wires.

Moreover, the width of the leading wire 7 may be arranged equal to the width of the linear wires 2, 3. In addition, the leading wire 7 may be arranged along the linear wire 3. Furthermore, the leading wire 7 may be arranged in a non-linear fashion, for example in a zigzag manner, in which the leading wire 7 is arranged to extend toward the linear wire 2 and toward the linear wire 3, alternately. In any case, the leading wire 7 can be arranged less-visible by being arranged parallel to the linear wire 2 and/or linear wire 3.

Furthermore, the width of the separation portion 4 is arranged smaller than the distance between the linear wires 2, 2 or the distance between the linear wires 3, 3 and is arranged larger than the width of the respective linear wires 2, 3. This arrangement is preferable because at the boundary between the sensor portion 5 and the dummy sensor portion 6 or the boundary between the leading wire 7 of the sensor portion 5 and the dummy sensor portion 6, the respective ends of the linear wires 2 and 3 are disposed next to each other across the separation portion 4 by necessity, or the end of one linear wire and the other linear wire are disposed next to each other across the separation portion 4.

The embodiments described herein are only representative embodiments and are not intended to limit the present invention. It will be understood that various modifications to the embodiments may be made without departing the scope of the present invention.

What is claimed is:

1. A touch sensor comprising:
   a substrate: and
   a grid pattern formed on a surface of the substrate by a plurality of first linear wires and a plurality of second linear wires, the grid pattern being formed integrally by a non-translucent conductive film, wherein
   the first linear wires are arranged parallel to each other at a predetermined interval, and the second linear wires are arranged parallel to each other at a predetermined interval and intersecting with the first linear wires, and
   a separation portion is provided to the first linear wires and the second linear wires by cutting a portion of the first and the second linear wires to form a sensor portion and a dummy sensor portion which are located next to each other and electrically separated from each other,
   wherein a gap between the adjacent sensor portion and the dummy portion is formed into a non-band-like shape,
   wherein a leading wire which is a portion of one of the first linear wire and the second linear wire constituting the sensor portion in the grid is arranged to extend out of the dummy sensor portion through the separation portion of another one of the first linear wire and the second linear wire constituting the dummy sensor portion, so that, at a gap between the dummy sensor portion and the leading wire extending parallel to said one of the first linear wire and the second linear wire constituting the sensor portion, an end of said another one of the first linear wire and the second linear wire constituting the dummy sensor portion is located adjacent to the leading wire across the separation portion.

2. The touch sensor according to claim 1, wherein respective ends of the first or the second linear wires are disposed next to each other across the separation portion.

3. The touch sensor according to claim 1, wherein an end of at least one of the first linear wire and the second linear wire and an end of the other one of the first linear wire and the second linear wire are disposed next to each other across the separation portion.

4. A fluorescent display comprising:
   an envelope;
   a cathode arranged inside of the envelope and emits electrons;
   an anode arranged inside of the envelope and having a phosphor layer, the phosphor layer being arranged to emit light when the electrons emitted by the cathode impinge on the phosphor layer; and
   a touch sensor having a substrate and a grid pattern formed on a surface of the envelope by a plurality of first linear wires and a plurality of second linear wires, the grid pattern being formed integrally by a non-translucent conductive film, wherein the first linear wires are arranged parallel to each other at a predetermined interval, and the second linear wires are arranged parallel to each other at a predetermined interval and intersecting with the first linear wires, wherein a separation portion is provided to the first linear wires and the second linear wires and the second linear wires by cutting a portion of the first and the second linear wires to form a sensor portion and a dummy sensor portion which are located next to each other and electrically separated from each other, and wherein a gap between the adjacent sensor portion and the dummy portion is formed into a non-band-like shape, wherein a leading wire which is a portion of one of the first linear wire and the second linear wire constituting the sensor portion of the grid is arranged to extend out of the dummy sensor portion through the separation portion of another one of the first linear wire and the second linear wire constituting the dummy sensor portion, so that, at a gap between the dummy sensor portion and the leading wire extending parallel to said one of the first linear wire and the second linear wire constituting the sensor portion, an end of said another one of the first linear wire and the second linear wire constituting the dummy sensor portion is located adjacent to the leading wire across the separation portion.

5. The fluorescent display according to claim 4, wherein respective ends of the first or the second linear wires are disposed next to each other across the separation portion.

6. The fluorescent display according to claim 4, wherein an end of one of the first linear wire and the second linear wire and the other one of the first linear wire and the second linear wire are disposed next to each other across the separation portion.

* * * * *